(12) United States Patent
Park et al.

(10) Patent No.: US 11,613,692 B2
(45) Date of Patent: Mar. 28, 2023

(54) QUANTUM DOT-POLYMER COMPOSITE PATTERN, PRODUCTION METHOD THEREOF, AND ELECTRONIC DEVICE INCLUDING THE SAME

(71) Applicant: Samsung Display Co., Ltd., Yongin-si (KR)

(72) Inventors: Shang Hyeun Park, Yongin-si (KR); Tae Gon Kim, Hwaseong-si (KR); Shin Ae Jun, Seongnam-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 341 days.

(21) Appl. No.: 16/881,697

(22) Filed: May 22, 2020

(65) Prior Publication Data

US 2020/0369955 A1 Nov. 26, 2020

(30) Foreign Application Priority Data

May 24, 2019 (KR) .......................... 10-2019-0061519

(51) Int. Cl.
*C09K 11/02* (2006.01)
*G03F 7/32* (2006.01)
(Continued)

(52) U.S. Cl.
CPC ............ *C09K 11/02* (2013.01); *C08F 212/08* (2013.01); *C08F 220/06* (2013.01);
(Continued)

(58) Field of Classification Search
CPC ....... C09K 11/02; C09K 11/025; C09K 11/06; C08K 3/22; C08K 5/37; G03F 7/26; G03F 7/38
See application file for complete search history.

(56) References Cited

U.S. PATENT DOCUMENTS 10,759,993 B2 * 9/2020 Yang ...................... G02B 6/005
10,851,297 B2 * 12/2020 Kim ..................... G03F 7/0047
(Continued)

FOREIGN PATENT DOCUMENTS

CN 103772872 A 5/2014
CN 107446577 A 12/2017
(Continued)

OTHER PUBLICATIONS

Machine translation of 110305349 (no date).*
(Continued)

*Primary Examiner* — Amanda C. Walke
(74) *Attorney, Agent, or Firm* — Cantor Colburn LLP

(57) ABSTRACT

A quantum dot-polymer composite pattern including at least one repeating section configured to emit light of a predetermined wavelength, and a production method and a display device including the quantum dot-polymer composite are disclosed. The quantum dot-polymer composite includes a polymer matrix including linear polymer including a carboxylic acid group-containing repeating unit and a plurality of cadmium-free quantum dots dispersed in the polymer matrix, has an absorption rate of greater than or equal to about 85% for light at wavelength of about 450 nm, and has an area ratio of a hydroxy group peak relative to an acrylate peak of greater than or equal to about 2.6 in Fourier transform infrared spectroscopy.

27 Claims, 5 Drawing Sheets

(51) Int. Cl.
*G03F 7/20* (2006.01)
*G03F 7/38* (2006.01)
*C08F 212/08* (2006.01)
*C08F 220/06* (2006.01)
*C08F 220/28* (2006.01)
*C08K 5/37* (2006.01)
*C08K 3/22* (2006.01)
*C08F 220/18* (2006.01)
*B82Y 20/00* (2011.01)
*B82Y 40/00* (2011.01)

(52) U.S. Cl.
CPC .... *C08F 220/1807* (2020.02); *C08F 220/281* (2020.02); *C08K 3/22* (2013.01); *C08K 5/37* (2013.01); *G03F 7/2002* (2013.01); *G03F 7/32* (2013.01); *G03F 7/38* (2013.01); *B82Y 20/00* (2013.01); *B82Y 40/00* (2013.01); *C08K 2003/2241* (2013.01)

(56) References Cited

U.S. PATENT DOCUMENTS

| | | | |
|---|---|---|---|
| 10,983,432 B2 | 4/2021 | Jun et al. | |
| 10,983,433 B2 | 4/2021 | Park et al. | |
| 10,990,006 B2 | 4/2021 | Park et al. | |
| 11,142,685 B2* | 10/2021 | Won | C09K 11/0883 |
| 11,180,695 B2* | 11/2021 | Kim | C09K 11/565 |
| 11,352,555 B2* | 6/2022 | Park | H01L 27/322 |
| 11,352,558 B2* | 6/2022 | Kim | H01L 33/005 |
| 2011/0017951 A1* | 1/2011 | Ryowa | C09K 11/02 |
| | | | 977/773 |
| 2015/0083970 A1* | 3/2015 | Koh | C09K 11/70 |
| | | | 977/774 |
| 2016/0011506 A1* | 1/2016 | Gu | G03F 7/029 |
| | | | 430/281.1 |
| 2017/0153382 A1* | 6/2017 | Wang | H01L 33/504 |
| 2018/0217450 A1* | 8/2018 | Ma | G02F 1/133514 |
| 2019/0129302 A1* | 5/2019 | Youn | G03F 7/105 |
| 2020/0385632 A1* | 12/2020 | Wong | C09K 11/025 |

FOREIGN PATENT DOCUMENTS

| | | | | |
|---|---|---|---|---|
| CN | 109306263 A | * | 2/2019 | |
| CN | 110305349 A | * | 10/2019 | ........... C09K 11/025 |
| CN | 111808606 A | * | 10/2020 | ............ C08K 3/16 |
| CN | 112684492 A | * | 4/2021 | |
| KR | 101699540 B1 | | 6/2010 | |
| KR | 1020110004775 A | | 1/2011 | |
| KR | 101641367 B1 | | 7/2016 | |
| KR | 1020180094788 A | | 8/2018 | |
| WO | WO-2021042458 A1 | * | 3/2021 | ........... C09K 11/025 |

OTHER PUBLICATIONS

Machine translation of 111808606 (no date).*
Machine translation of 112684492 (no date).*
Amjad Y. Nazzal, et al., Environmental Effects on Photoluminescence of Highly Luminescent CdSe and CdSe/ZnS Core/Shell Nanocrystals in Polymer Thin Films, J. Phys. Chem. B 2004, 108, 5507-5515.
Hwea Yoon Kim, et al., Quantum Dot/Siloxane Composite Film Exceptionally Stable against oxidation under Heat and Moisture, J. Am. Chem. Soc., 2016, vol. 138, No. 50, pp. 16478-16485.
Katrin Pechstedt, et al., Photoluminescence of Colloidal CdSe/ZnS Quantum Dots: The Critical Effect of WaterMolecules, J. Phys. Chem. C 2010, 114, 12069-12077.
S. R. Cordero, et al., Photo-Activated Luminescence of CdSe Quantum Dot Monolayers, J. Phys. Chem. B 2000, 104, 12137-12142.

* cited by examiner

QUANTUM DOT-POLYMER COMPOSITE PATTERN, PRODUCTION METHOD THEREOF, AND ELECTRONIC DEVICE INCLUDING THE SAME

CROSS-REFERENCE TO RELATED APPLICATION

This application claims priority to Korean Patent Application No. 10-2019-0061519 filed in the Korean Intellectual Property Office on May 24, 2019, and all the benefits accruing therefrom under 35 U.S.C. § 119, the entire content of which is incorporated herein by reference.

BACKGROUND

1. Field

A quantum dot-polymer composite pattern, a production method for making the quantum dot-polymer composite pattern, and an electronic device including the quantum dot-polymer composite pattern are disclosed.

2. Description of the Related Art

Quantum dots may be applicable for various display devices such as a liquid crystal display in the form of a quantum dot-polymer composite. In order to be applied to various display devices, a quantum dot-polymer composite having improved properties is of interest and needs to be developed.

SUMMARY

An embodiment provides a quantum dot-polymer composite pattern capable of exhibiting improved properties.

Another embodiment provides a method of producing the quantum dot-polymer composite pattern.

Another embodiment provides a display device including the quantum dot-polymer composite pattern.

A quantum dot-polymer composite pattern according to an embodiment includes at least one repeating section configured to emit light of a predetermined wavelength, wherein the quantum dot-polymer composite comprises a polymer matrix including a linear polymer including a carboxylic acid group-containing repeating unit and a plurality of cadmium-free quantum dots dispersed in the polymer matrix, the quantum dot-polymer composite has a light absorption rate of greater than or equal to about 85% at wavelength of about 450 nanometers (nm), and an area ratio of a hydroxy group peak relative to an acrylate peak of greater than or equal to about 2.6 as determined by Fourier transform infrared spectroscopy.

The repeating section may include a first section configured to emit first light, a second section configured to emit a second light that is different from the first light, or a combination thereof.

A maximum peak wavelength of the first light may be in a range of greater than about 580 nm and less than or equal to about 680 nm.

A maximum peak wavelength of the second light may be in a range of greater than about 480 nm and less than or equal to about 580 nm.

The linear polymer may have an acid value of greater than or equal to about 50 mg KOH/g. The linear polymer may have an acid value of less than or equal to about 250 mg KOH/g.

The linear polymer may include a copolymer of a monomer mixture including a first monomer including a carboxylic acid group and a carbon-carbon double bond, a second monomer having a carbon-carbon double bond and a hydrophobic moiety and not including a carboxylic acid group, and optionally a third monomer having a carbon-carbon double bond and a hydrophilic moiety and not including a carboxylic acid group;

a multiple aromatic ring-containing polymer having a backbone structure in which two aromatic rings in a main chain are bonded with a quaternary carbon atom of another cyclic moiety, the multiple aromatic ring-containing polymer including a carboxylic acid group (—COOH); or a combination thereof.

The first monomer may include carboxylic acid vinyl ester.

The second monomer may include an alkenyl aromatic compound, $R^1OCOCR=CR_2$ wherein $R^1$ is a C1 to C10 alkyl, a C1 to C10 aminoalkyl, a C6 to C30 aryl, a C7 to C30 alkylaryl, or a C3 to C30 cycloalkyl and each R is the same or different and is each independently hydrogen, a C1 to C10 alkyl, or a combination thereof, maleimide, a (meth)acrylate having a glycidyl group, a vinyl cyanide compound, (meth)acrylamide, or a combination thereof.

The third monomer may include hydroxyalkyl (meth)acrylate.

The polymer matrix may further include a crosslinked polymer.

The crosslinked polymer may include a thiolene resin, a crosslinked poly(meth)acrylate, a crosslinked polyurethane, a crosslinked epoxy resin, a crosslinked vinyl polymer, a crosslinked silicone resin, or a combination thereof.

The crosslinked polymer may include a polymerization product of a monomer combination of an ethylenic unsaturated monomer including a (meth)acrylate monomer, a vinyl monomer, or a combination thereof and a thiol compound having at least two thiol (—SH) groups.

The polymer matrix may not include an organic siloxane moiety.

The quantum dot-polymer composite may have a thickness of greater than or equal to about 6 micrometers.

The quantum dot-polymer composite may have a light absorption rate of greater than or equal to about 89%.

In the quantum dot-polymer composite, a content of the quantum dot may be greater than or equal to about 40 wt % based on a total weight of the quantum dot-polymer composite. In the quantum dot-polymer composite, a content of the quantum dot may be greater than or equal to about 43 wt % based on a total weight of the quantum dot-polymer composite.

In Fourier transform infrared spectroscopy of the quantum dot-polymer composite, an area ratio of a hydroxy peak relative to an acrylate peak may be greater than or equal to about 3.0, for example, greater than or equal to about 3.4, or greater than or equal to about 3.5.

The quantum dot-polymer composite may have an area ratio of a hydroxy peak relative to an aryl group peak of greater than or equal to about 10 in Fourier transform infrared spectroscopy. The aryl group peak may refer to an aromatic peak that can be assigned to an aromatic C=C stretch.

The quantum dot-polymer composite may have an area ratio of a hydroxy peak relative to an aryl group peak of greater than or equal to about 12 in Fourier transform infrared spectroscopy.

The quantum dot-polymer composite may have luminous efficiency of greater than or equal to about 33%. The quantum dot-polymer composite may have a deep trap contribution emission of less than about 6%, wherein the deep trap contribution emission is obtained from an area ratio of a deep trap emission peak relative to a band-edge emission peak (e.g., maximum emission peak) in an emission spectrum.

The quantum dot-polymer composite may have deep trap contribution emission of less than or equal to about 5%.

The quantum dot-polymer composite may have deep trap contribution emission of less than or equal to about 4%.

The quantum dot-polymer composite may have a ratio of deep trap luminous efficiency relative to a quantum yield (QY) of less than or equal to about 0.1.

The quantum dot-polymer composite may further include metal oxide fine particles dispersed in the polymer matrix.

The quantum dot-polymer composite may include greater than or equal to about 40% and less than or equal to about 60% of the quantum dot, greater than or equal to about 4% and less than or equal to about 15% of the metal oxide fine particles, and a balance of the polymer matrix based on a total weight of the quantum dot-polymer composite.

Another embodiment provides a method of producing the aforementioned quantum dot-polymer composite pattern includes obtaining a film of a composition including a linear polymer including a carboxylic acid group-containing repeating unit, a plurality of cadmium-free quantum dots, an ethylenic unsaturated monomer, and a thiol compound having at least two thiol (—SH) groups, and optionally at least one of a (photo)initiator and a metal oxide fine particle;

exposing the film to light of a wavelength of less than or equal to about 420 nm under a mask having a predetermined pattern;

contacting the film exposed to the light with an alkali developing solution to dissolve and remove the unexposed portion of the film to obtain a pattern;

heat-treating the pattern at a temperature of greater than or equal to about 180° C. for greater than or equal to about 10 minutes; and placing the heat-treated pattern under a relative humidity of greater than or equal to about 65% at a temperature of greater than or equal to about 65° C. for a time period of greater than or equal to about 10 minutes and less than or equal to about 1 hour.

The heat-treated pattern may be placed under a condition of greater than or equal to about 75° C. and relative humidity of greater than or equal to about 75%.

In another embodiment, a display device includes a light source and a (photo) luminescent element, wherein the (photo)luminescent element includes the aforementioned quantum dot-polymer composite pattern, the repeating section includes a first section configured to emit first light and a second section configured to emit a second light that is different from the first light, and the light source is configured to provide the (photo) luminescent element with incident light.

The incident light may have a peak wavelength within a range of about 440 nm to about 460 nm.

The light source may include a plurality of light emitting units respectively corresponding to the first section and the second section, and the light emitting units may include a first electrode and a second electrode that face each other and an electroluminescent layer disposed between the first electrode and the second electrode.

The display device may further include a lower substrate, a polarizer disposed under the lower substrate, and, a liquid crystal layer disposed between the quantum dot-polymer composite pattern and the lower substrate. The display device may be configured to have color reproducibility of greater than or equal to about 80% based on BT2020.

The quantum dot-polymer composite pattern obtained by the method according to an embodiment may exhibit improved quantum efficiency. Such a quantum dot-polymer composite pattern may contribute to quality improvement of a display device.

DETAILED DESCRIPTION

Figure 1:
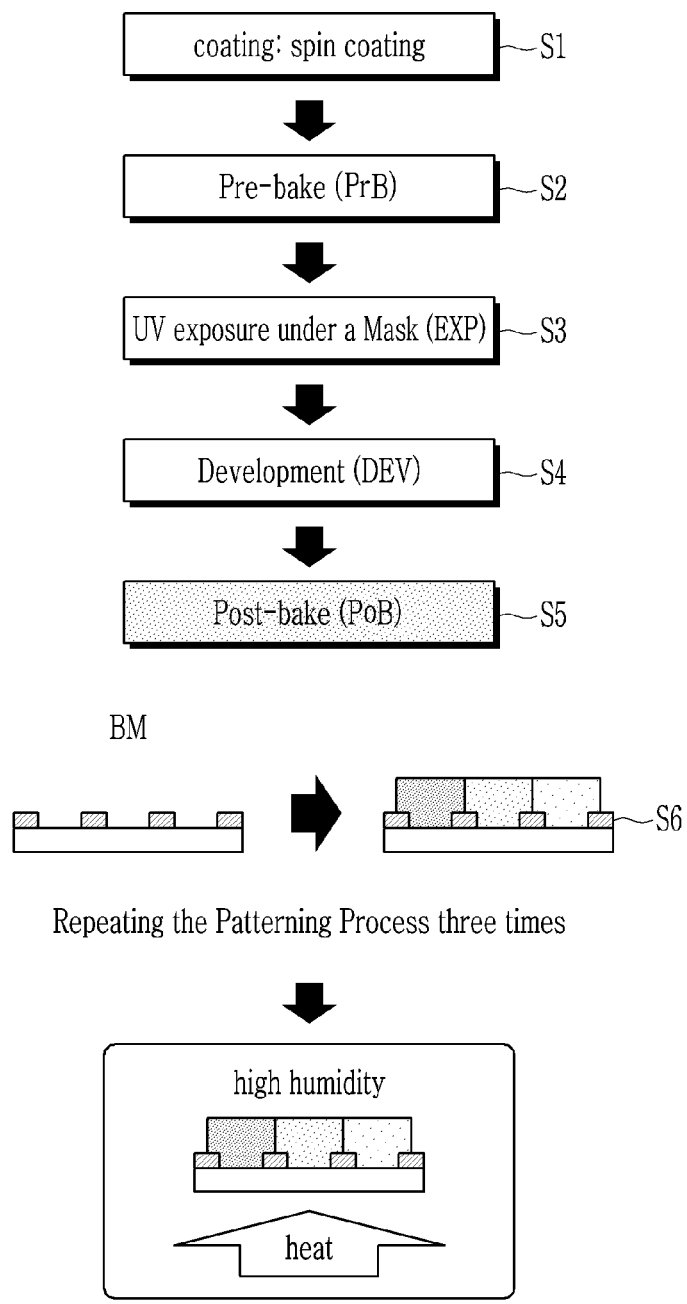
FIG. 1 is a schematic view showing a method of producing a quantum dot-polymer composite pattern according to an embodiment.

Advantages and characteristics of the disclosed quantum dot-polymer composite pattern, and a method for achieving the same, will become evident referring to the following example embodiments together with the drawings attached hereto.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

If not defined otherwise, all terms (including technical and scientific terms) in the specification may be defined as commonly understood by one skilled in the art. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

In the drawings, the thickness of layers, films, panels, regions, etc., are exaggerated for clarity. Like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±10% or 5% of the stated value.

As used herein, when a definition is not otherwise provided, "substituted" refers to replacement of hydrogen of a compound, a group, or a moiety by a substituent selected from a C1 to C30 alkyl group, a C1 to C30 alkenyl group, a C2 to C30 alkynyl group, a C2 to C30 epoxy group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, a halogen (—F, —Cl, —Br, or —I), a hydroxy group (—OH), a nitro group (—$NO_2$), a cyano group (—CN), an amino group (—NRR' wherein R and R' are each independently hydrogen or a C1 to C6 alkyl group), an azido group (—$N_3$), an amidino group (—O(=NH)$NH_2$), a hydrazino group (—$NHNH_2$), a hydrazono group (=N($NH_2$)), an aldehyde group (—O(=O)H), a carbamoyl group (—C(O)$NH_2$), a thiol group (—SH), an ester group (—O(=O)OR, wherein R is a C1 to C6 alkyl group or a C6 to C12 aryl group), a carboxyl group (—OOOH) or a salt thereof (—O(=O)OM, wherein M is an organic or inorganic cation), a sulfonic acid group (—$SO_3H$) or a salt thereof (—$SO_3M$, wherein M is an organic or inorganic cation), a phosphoric acid group (—$PO_3H_2$) or a salt thereof (—$PO_3MH$ or —$PO_3M_2$, wherein M is an organic or inorganic cation), and a combination thereof.

Herein, "monovalent organic functional group" refers to a C1 to C30 alkyl group, a C2 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, or a C2 to C30 heterocycloalkyl group.

As used herein, when a definition is not otherwise provided, the term "hetero" refers to inclusion of at least one (e.g., 1 to 3) selected from N, O, S, Si, and P.

As used herein, when a definition is not otherwise provided, "alkylene group" refers to a straight or branched saturated aliphatic hydrocarbon group having at least two valences and optionally substituted with at least one substituent. As used herein, when a definition is not otherwise provided, "arylene group" refers to a functional group having at least two valences obtained by removal of at least two hydrogens in at least one aromatic ring, and optionally substituted with at least one substituent.

As used herein, when a definition is not otherwise provided, "aliphatic organic group" refers to a C1 to C30 linear or branched hydrocarbon group (e.g., C1 to C30 alkyl, C2 to C30 alkenyl, C2 to C30 alkynyl), "aromatic organic group" refers to a C6 to C30 aryl group or a C2 to C30 heteroaryl group, and "alicyclic organic group" refers to a C3 to C30 cycloalkyl group, a C3 to C30 cycloalkenyl group, or a C3 to C30 cycloalkynyl group.

As used herein, when a definition is not otherwise provided, "(meth)acrylate" refers to acrylate and/or methacrylate.

As used herein, luminous efficiency refers to a degree of receiving blue light (e.g., from BLU, having a central wavelength of approximately 450 nm) and converting it into light having a different wavelength.

As used herein, the light absorption rate is a degree to which the quantum dot absorbs blue light. A total light amount of excitation light (B) is obtained by integrating a PL spectrum of excitation light, and a light amount (B') of the excitation light passing through a quantum dot composite film is obtained. The light absorption rate is obtained by the following equation:

$$(B-B')/B \times 100\% = \text{light absorption rate (\%)}$$

As used herein, "Group" refers to a group of Periodic Table.

As used herein, "Group II" refers to Group IIA and Group IIB, and examples of Group II metal may be Cd, Zn, Hg, and Mg, but are not limited thereto.

As used herein, "Group III" refers to Group IIIA and Group IIIB, and examples of Group III metal may be Al, In, Ga, and Tl, but are not limited thereto.

As used herein, "Group IV" refers to Group IVA and Group IVB, and examples of a Group IV metal may be Si, Ge, and Sn, but are not limited thereto. As used herein, the term "metal" may include a semi-metal such as Si.

As used herein, "Group I" refers to Group IA and Group IB, and examples may include Li, Na, K, Rb, and Cs, but are not limited thereto.

As used herein, "Group V" refers to Group VA, and examples may include nitrogen, phosphorus, arsenic, antimony, and bismuth, but are not limited thereto.

As used herein, "Group VI" refers to Group VIA, and examples may include sulfur, selenium, and tellurium, but are not limited thereto.

A liquid crystal display (hereinafter, LCD) realizes colors by polarized light passing an absorption type color filter after passing a liquid crystal. LCD has a problem of a narrow viewing angle and low light transmittance due to the absorption type color filter. The absorption type color filter may be replaced with a photoluminescent type color filter including the quantum dot to realize a wider viewing angle and improved luminance.

If a quantum dot is colloid-synthesized, the average particle size of the quantum dot may be controlled, and also with a relative uniform average particle size distribution. If a quantum dot has an average particle size of less than or equal to about 10 nm, the quantum confinement effect in which the bandgap increases with decreasing average particle size becomes more significant, and the energy density is enhanced. A quantum dot has a theoretical quantum efficiency (QY or QE) of 100% and may emit light having a high color purity (e.g., a full width at half maximum (FWHM) of less than or equal to about 40 nm), it may enhance luminous efficiency and improve a color reproducibility.

The quantum dot may be dispersed in a host matrix (e.g., including a polymer and/or an inorganic material) to form a composite and be applied to a (e.g. display) device. A color filter including the quantum dot-polymer composite is expected to produce displays having high luminance, wide viewing angles, and high color reproducibility.

The patterning of a quantum dot-polymer composite however has various technical limits unlike that of a traditional absorption type color filter. For example, when the pattern is formed by dispersing quantum dots having relatively high efficiency in a host matrix capable of being subject to a photolithography, a significant decrease in quantum dot luminous efficiency may occur. Without being bound by any particular theory, a plurality of defects may substantially form on the surface of quantum dots in a high temperature heat-treatment process step after having mixed the quantum dots with a photoresist and exposure/development. The formed defects may result in many trap levels in an energy level for light emission, and therefore, one may observe a large decrease in luminous efficiency of the quantum dot-polymer composite pattern using photolithography d compared to an expected value from the quantum dot dispersion. Accordingly, a light emitting device including this quantum dot-polymer composite pattern may not easily achieve the expected and desired luminescence characteristics.

The quantum dot-polymer composite pattern according to an embodiment may exhibit a different chemical analysis result from the quantum dot polymer composite pattern of the conventional art with the use of an additional post-treatment process—a process method described later, and thus, may exhibit improved luminous efficiency and light conversion efficiency.

A quantum dot-polymer composite pattern according to an embodiment includes at least one repeating section configured to emit light of a predetermined wavelength. The quantum dot-polymer composite is disposed in at least one of the repeating sections (R, G, and B) to constitute a quantum dot-polymer composite pattern.

The repeating section may include a first section configured to emit first light. The repeating section may further include a second section configured to emit a second light that is different from the first light; a third section that emits and/or passes a third light that is different from the first light and the second light; or both. In an embodiment, a maximum peak wavelength of the first light may be in the range of a red light wavelength of about 580 nm to about 680 nm (e.g., a red light wavelength of about 600 nm to about 650 nm). The first section may be an R section that emits red light, but is not limited thereto. A maximum peak wavelength of the second light may be in the range of about 480 nm to about 580 nm (e.g., a green light wavelength of about 500 nm to about 560 nm). The second section may be a G section that emits green light, but is not limited thereto. A maximum peak wavelength of the third light may be in the range of about 380 nm to about 480 nm (e.g., a blue light wavelength of about 450 nm to about 470 nm). The third section may emit or transmit blue light, or both emit and transmit blue light, but is not limited thereto. The third section may not include a quantum dot. A black matrix (BM) may be disposed between repeating sections.

The quantum dot-polymer composite includes a polymer matrix including linear polymer including a carboxylic acid group-containing repeating unit and a plurality of cadmium-free quantum dots dispersed in the polymer matrix. The pattern may be in a form of a film. The quantum dot-polymer composite (or a pattern thereof) may have a light absorption rate of greater than or equal to about 85% for light at a wavelength of about 450 nm, and the quantum dot-polymer composite may have an area ratio of a hydroxy group peak relative to an acrylate peak (e.g., peak assigned to an acrylate group) of greater than or equal to about 2.6 as determined by Fourier transform infrared spectroscopy.

The quantum dot-polymer composite pattern may be disposed on the substrate. The substrate may be a substrate including an insulating material (e.g., insulating transparent substrate). The substrate may include glass; various polymers such as polyester of polyethylene terephthalate (PET), or polyethylene naphthalate (PEN), polycarbonate, and polyacrylate; polysiloxane (e.g. PDMS); an inorganic material such as $Al_2O_3$ or $ZnO$; or a combination thereof, but is not limited thereto. Herein, "transparent" refers to transmittance for light in a predetermined wavelength (e.g., light emitted from the quantum dots) of greater than or equal to about 85%, for example, greater than or equal to about 88%, greater than or equal to about 90%, greater than or equal to about 95%, greater than or equal to about 97%, or greater than or equal to about 99%. The predetermined wavelength may have a range determined within about 380 nm to about 780 nm. The ranges of predetermined wavelengths may be determined by considering the light emitted from each section. A thickness of the substrate may be appropriately selected considering a substrate material, and the like, but is not particularly limited. The transparent substrate may have flexibility. The quantum dot-polymer composite pattern disposed on the substrate may form a stack structure.

The polymer matrix includes a linear polymer having a carboxylic acid group—containing repeating unit. The carboxylic acid group-containing repeating unit may be derived from a monomer including a carboxyl group and a carbon-carbon double bond, a monomer having a dianhydride moiety, or a combination thereof. The linear polymer having carboxylic acid group-containing repeating unit (hereinafter, also referred to as a carboxylic acid polymer) may include a copolymer of a monomer mixture including a first monomer including a carboxyl group and carbon-carbon double bond, a second monomer having a carbon-carbon double bond and a hydrophobic moiety and not including a carboxyl group, and optionally third monomer having a carbon-carbon double bond and a hydrophilic moiety and not including a carboxyl group;

a multiple aromatic ring-containing polymer having a backbone structure in which two aromatic rings in a main chain are bonded with a quaternary carbon atom of another cyclic moiety, the multiple aromatic ring-containing polymer including a carboxyl group (—COOH); or a combination thereof.

In the copolymer, examples of the first monomer may include acrylic acid, methacrylic acid, maleic acid, itaconic acid, fumaric acid, 3-butenoic acid, carboxylic acid vinyl ester compounds such as vinyl acetate, vinyl benzoate, and the like, but are not limited thereto. The first monomer may be one or more different compounds.

Examples of the second monomer may be an alkenyl aromatic compound such as styrene, alpha-methyl styrene, vinyl toluene, vinyl benzyl methyl ether, and the like; a compound represented by $R^1OCOCR=CR_2$ wherein $R^1$ is a C1 to C10 alkyl, a C1 to C10 aminoalkyl, a C6 to C30 aryl, a C7 to C30 alkylaryl, or a C3 to C30 cycloalkyl and each R is the same or different and is each independently hydrogen, a C1 to C10 alkyl, or a combination thereof, for example, an alkyl(meth)acrylatesuch as methyl acrylate, methyl methacrylate, ethyl acrylate, ethyl methacrylate, butyl acrylate, butyl methacrylate, and the like; an alkylaryl (meth)acrylate such as benzyl acrylate, benzyl methacrylate, and the like; a cycloalkyl(meth)acrylate such as cyclohexyl acrylate, cyclohexyl methacrylate, phenyl acrylate, phenyl methacrylate, and the like; an unsaturated aminoalkyl(meth)

acrylatecompound such as 2-amino ethyl acrylate, 2-amino ethyl methacrylate, 2-dimethyl amino ethyl (meth)acrylate, and the like; maleimide such as N-phenylmaleimide, N-benzylmaleimide, N-alkylmaleimide, and the like; an unsaturated carbonic acid glycidyl ester compound such as glycidyl acrylate, glycidyl methacrylate, and the like; a vinyl cyanide compound such as acrylonitrile, methacrylonitrile, and the like; an unsaturated amide compound such as acryl amide, methacrylamide, and the like, but are not limited thereto. The second monomer may be one or more compounds. Examples of the third monomer may include hydroxyalkyl (meth)acrylate, such as 2-hydroxyethyl acrylate, 2-hydroxyethyl methacrylate, 2-hydroxybutyl acrylate, and 2-hydroxybutyl methacrylate but are not limited thereto. The third monomer may be one or more compounds.

The copolymer may include a first repeating unit derived from the first monomer, a second repeating unit derived from the second monomer, and optionally a third repeating unit derived from the third monomer. In the copolymer, a content of the first repeating unit may be greater than or equal to about 5 mole percent (mol %), for example, greater than or equal to about 10 mol %, greater than or equal to about 15 mol %, greater than or equal to about 25 mol %, or greater than or equal to about 35 mol %. In the copolymer the content of the first repeating unit may be less than or equal to about 95 mol %, for example, less than or equal to about 90 mol %, less than or equal to about 89 mol %, less than or equal to about 80 mol %, less than or equal to about 70 mol %, less than or equal to about 60 mol %, less than or equal to about 50 mol %, less than or equal to about 40 mol %, less than or equal to about 35 mol %, or less than or equal to about 25 mol %. In the copolymer, a content of the second repeating unit may be greater than or equal to about 5 mol %, for example, greater than or equal to about 10 mol %, greater than or equal to about 15 mol %, greater than or equal to about 25 mol %, or greater than or equal to about 35 mol %. In the copolymer, the content of the second repeating unit may be less than or equal to about 95 mol %, for example, less than or equal to about 90 mol %, less than or equal to about 89 mol %, less than or equal to about 80 mol %, less than or equal to about 70 mol %, less than or equal to about 60 mol %, less than or equal to about 50 mol %, less than or equal to about 40 mol %, less than or equal to about 35 mol %, or less than or equal to about 25 mol %. In the copolymer, if present, a content of the third repeating unit may be greater than or equal to about 1 mol %, for example, greater than or equal to about 5 mol %, greater than or equal to about 10 mol %, or greater than or equal to about 15 mol %. In the binder polymer, the content of the third repeating unit may be less than or equal to about 20 mol %, for example, less than or equal to about 15 mol %, or less than or equal to about 10 mol %.

The copolymer may be a copolymer of (meth)acrylic acid; and at least one second/third monomer selected from arylalkyl(meth)acrylate, hydroxyalkyl (meth)acrylate, and styrene. For example, the copolymer may include a (meth)acrylic acid/methyl (meth)acrylate copolymer, a (meth)acrylic acid/benzyl (meth)acrylate copolymer, a (meth)acrylic acid/benzyl (meth)acrylate/styrene copolymer, a (meth)acrylic acid/benzyl (meth)acrylate/2-hydroxy ethyl (meth)acrylate copolymer, or a (meth)acrylic acid/benzyl (meth)acrylate/styrene/2-hydroxy ethyl(meth)acrylate copolymer.

The carboxylic acid polymer may include a multiple aromatic ring-containing polymer. The multiple aromatic ring-containing polymer has a backbone structure in which two aromatic rings in a main chain are bonded with a quaternary carbon atom of another cyclic moiety and carboxyl group (—COOH) (e.g., bound to the main chain). The multiple aromatic ring-containing polymer may be an acid addition product of bisphenol fluorene epoxy acrylate. For example, the acid addition product of bisphenol fluorene epoxy acrylate may be obtained by reacting 4,4-(9-fluorenylidene)-diphenol with epichlorohydrin to obtain an epoxy compound with a fluorene moiety, reacting the epoxy compound with acrylic acid to obtain fluorenyl epoxyacrylate having a hydroxy group, and reacting the same with biphenyl dianhydride and/or phthalic anhydride again. Such a multiple aromatic ring-containing polymer that is also known as a cardo resin, is commercially available.

The carboxylic acid polymer may have an acid value of greater than or equal to about 50 milligrams KOH per gram (mg KOH/g). For example, the carboxylic acid polymer may have an acid value of greater than or equal to about 60 mg KOH/g, greater than or equal to about 70 mg KOH/g, greater than or equal to about 80 mg KOH/g, greater than or equal to about 90 mg KOH/g, greater than or equal to about 100 mg KOH/g, greater than or equal to about 110 mg KOH/g, or greater than or equal to about 120 mg KOH/g. The carboxylic acid polymer may have an acid value of less than or equal to about 250 mg KOH/g, for example, less than or equal to about 200 mg KOH/g, for example, less than or equal to about 190 mg KOH/g, less than or equal to about 180 mg KOH/g, or less than or equal to about 160 mg KOH/g. The carboxylic acid polymer may have an acid value of greater than or equal to about 80 mg KOH/g, and less than or equal to about 180 mg KOH/g or about 200 mg KOH/g.

The polymer matrix may further include a crosslinked polymer. The crosslinked polymer may be a crosslinked polymer by light.

The crosslinked polymer may include a thiolene resin, crosslinked poly(meth)acrylate, crosslinked polyurethane, a crosslinked epoxy resin, a crosslinked vinyl polymer, a crosslinked silicone resin, or a combination thereof.

The crosslinked polymer may be a copolymer. The crosslinked polymer may be a polymerization product of photopolymerizable compounds (e.g., monomers or oligomers), having one or more, for example, two, three, four, five, six, or more photopolymerizable functional groups (e.g., a carbon-carbon double bond such as a (meth)acrylate group or a vinyl group, an epoxy group, etc.). The photopolymerizable compound may be a generally-used photopolymerizable monomer or oligomer in a photosensitive resin composition. The crosslinked polymer may include a polymerization product of a monomer combination including an ethylenic unsaturated monomer including a (meth)acrylate monomer, a vinyl monomer, or a combination thereof and a thiol compound having at least two thiol (—SH) groups.

In an embodiment, the photopolymerizable compound may include an ethylenic unsaturated monomer such as an acrylate monomer or a vinyl monomer; a reactive oligomer (e.g., ethylene oligomer, alkylene oxide oligomer, etc.) having two or more photopolymerizable moieties (e.g., epoxy groups, vinyl groups, etc.); a copolymer of the reactive oligomer and the ethylenic unsaturated monomer; a urethane oligomer having two or more photopolymerizable moieties (e.g., acrylate moieties); a siloxane oligomer having two or more photopolymerizable moieties; or a combination thereof. The photopolymerizable compound may further include a thiol compound having at least two thiol groups at both terminal ends. The photopolymerizable compound may be commercially available or may be synthesized by a known method. The crosslinked polymer may be a polymerization product of a mixture including the photopolymerizable compound.

The (meth)acrylate monomer may include a monofunctional or multi-functional ester of (meth)acrylic acid having at least one carbon-carbon double bond. The (meth)acrylate monomer may include a di(meth)acrylate compound, a tri(meth)acrylate compound, a tetra(meth)acrylate compound, a penta(meth)acrylate compound, a hexa(meth)acrylate compound, or a combination thereof. Examples of the (meth)acrylate monomer may be C1 to C30 alkyl(meth) acrylate, ethylene glycoldi(meth)acrylate, triethylene glycoldi(meth)acrylate, diethylene glycoldi(meth)acrylate, 1,4-butanedioldi(meth)acrylate, 1,6-hexanedioldi(meth) acrylate, neopentylglycoldi(meth)acrylate, pentaerythritoldi (meth)acrylate, pentaerythritoltri(meth)acrylate, pentaerythritoltetra(meth)acrylate, dipentaerythritoldi (meth)acrylate, dipentaerythritoltri(meth)acrylate, dipentaerythritolpenta(meth)acrylate, dipentaerythritolhexa (meth)acrylate, bisphenol A epoxy(meth)acrylate, bisphenol A di(meth)acrylate, trimethylolpropanetri(meth)acrylate, novolac epoxy (meth)acrylate, ethylglycolmonomethylether (meth)acrylate, tris(meth)acryloyloxyethyl phosphate, or propylene glycoldi(meth)acrylate, but are not limited thereto.

The thiol compound may be a dithiol compound, a trithiol compound, a tetrathiol compound, or a combination thereof. For example, the thiol compound may be glycoldi-3-mercaptopropionate, glycoldimercapto acetate, trimethylolpropane tris(3-mercaptopropionate), pentaerythritol tetrakis(3-mercaptopropionate), pentaerythritol tetrakis(2-mercaptoacetate), 1,6-hexanedithiol, 1,3-propanedithiol, 1,2-ethanedithiol, polyethylene glycol dithiol including 1 to 10 ethylene glycol repeating units, or a combination thereof. The reaction between the thiol compound and the ethylenic unsaturated monomer may form a thiol-ene resin.

The polymer matrix may not include an organic siloxane or a moiety thereof. The organic siloxane or a moiety thereof may have a unit represented by the following chemical formula:

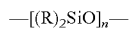

—[(R)$_2$SiO]$_n$— wherein R is hydrogen, a C1 to C30 alkoxy group, a substituted or unsubstituted C1 to C30 (aromatic, aliphatic, or alicyclic) hydrocarbon group, or a combination thereof and n is related to a number indicating a molecular weight of the organic siloxane (e.g., greater than or equal to about 1 and less than or equal to about 100) and is not particularly limited. Herein, in the above chemical formula, at least one R may be a C1 to C30 (aromatic, aliphatic, or alicyclic) hydrocarbon group.

The quantum dots (hereinafter, also referred to as semiconductor nanocrystals) (e.g., dispersed) disposed in the polymer matrix may not include cadmium. The cadmium-free quantum dots may be synthesized by known methods and/or commercially available.

The quantum dots (hereinafter, also referred to as semiconductor nanocrystals) may include a Group II-VI compound, a Group III-V compound, a Group IV-VI compound, a Group IV element or compound, a Group compound, a Group compound, a Group I-II-IV-VI compound, or a combination thereof.

The Group II-VI compound may be selected from a binary compound selected from ZnS, ZnSe, ZnTe, ZnO, HgS, HgSe, HgTe, MgSe, MgS, and a mixture thereof; a ternary element compound selected from ZnSeS, ZnSeTe, ZnSTe, HgSeS, HgSeTe, HgSTe, HgZnS, HgZnSe, HgZnTe, MgZnSe, MgZnS, and a mixture thereof; and a quaternary element compound selected from HgZnTeS, HgZnSeS, HgZnSeTe, HgZnSTe, and a mixture thereof. The Group II-VI compound may further include a Group III metal. The Group III-V compound may be selected from a binary compound selected from GaN, GaP, GaAs, GaSb, AlN, AlP, AlAs, AlSb, InN, InP, InAs, InSb, and a mixture thereof; a ternary element compound selected from GaNP, GaNAs, GaNSb, GaPAs, GaPSb, AlNP, AlNAs, AlNSb, AlPAs, AlPSb, InNP, InNAs, InNSb, InPAs, InPSb, and a mixture thereof; and a quaternary element compound selected from GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof. The Group III-V compound may further include a Group II metal (e.g., InZnP). The Group IV-VI compound may be selected from a binary compound selected from SnS, SnSe, SnTe, PbS, PbSe, PbTe, and a mixture thereof; a ternary element compound selected from SnSeS, SnSeTe, SnSTe, PbSeS, PbSeTe, PbSTe, SnPbS, SnPbSe, SnPbTe, and a mixture thereof; and a quaternary element compound selected from SnPbSSe, SnPbSeTe, SnPbSTe, and a mixture thereof. Examples of the Group compound may include CuInSe$_2$, CuInS$_2$, CuInGaSe, and CuInGaS, but are not limited thereto. The Group compound may be selected from ZnGaS, ZnAlS, ZnInS, ZnGaSe, ZnAlSe, ZnInSe, ZnGaTe, ZnAlTe, ZnInTe, ZnGaO, ZnAlO, ZnInO, HgGaS, HgAlS, HgInS, HgGaSe, HgAlSe, HgInSe, HgGaTe, HgAlTe, HgInTe, MgGaS, MgAlS, MgInS, MgGaSe, MgAlSe, MgInSe, or a combination thereof, but are not limited thereto. The Group I-II-IV-VI compound may include CuZnSnSe and CuZnSnS, but are not limited thereto. The Group IV element or compound may be selected from a single element selected from Si, Ge, and a mixture thereof; and a binary element compound selected from SiC, SiGe, and a mixture thereof.

The binary element compound, the ternary element compound or the quaternary element compound respectively exist in a uniform concentration in the semiconductor nanocrystal particle or partially different concentrations in the same particle. The semiconductor nanocrystal may have a core/shell structure in which a first semiconductor nanocrystal surrounds another second semiconductor nanocrystal. The core and shell may have an interface, and an element of at least one of the core and/or the shell in the interface may have a concentration gradient wherein the concentration of the element(s) of the shell decreases toward the core. In addition, the semiconductor nanocrystal may have one core of a semiconductor nanocrystal and multi-shells surrounding the core. In an embodiment, the shell may be a multi-layered shell having two or more layers, for example, 2, 3, 4, 5, or more layers. Each layer of the shell may have the same composition or different composition from each other. The adjacent layers may have the different composition from each other. The material of each layer may include a single composition or a combination of two or more materials (e.g., an alloy). At least one element among materials of each layer may have a concentration changing along with a radial direction. For example, at least one layer may have a concentration gradient of the combination of the two or more materials. For example, at least one layer may include a gradient alloy. The layer including the combination of two or more materials such as an alloy may have a homogeneous composition (e.g., a homogeneous alloy). A layer having a concentration gradient of the combination of two or more materials (e.g., including a gradient alloy) may have a homogeneous alloy composition and the composition may be changed along with a radial direction.

In the quantum dots, the shell material and the core material may have different energy bandgaps. For example, the energy bandgap of the shell material may be larger than that of the core material. In another embodiment, the energy bandgap of the shell material may be less than that of the core material. If the quantum dots have a multi-layered shell, the energy bandgap of the outer layer may be larger than the energy bandgap of the layer close to the core. In a multi-layered shell, the energy bandgap of the outer layer may be smaller than the energy bandgap of the layer close to the core.

In an embodiment, the quantum dots may have a core including a Group III-V compound and a shell including a Group II-V compound. The core may include InP, InPAs, InAs, GaP, GaAs, InGaP, InGaAs, InGaPAs, or a combination thereof. The shell may include zinc, selenium, and optionally sulfur.

The quantum dots may control absorption/emission wavelengths by adjusting the (e.g. elemental) composition and/or the (e.g., average) particle size of the quantum dots. The maximum emission peak wavelengths of the quantum dots may be in the wavelength range of the aforementioned red light region, the wavelength range of the aforementioned green light region, or the wavelength range of the aforementioned blue light region.

The quantum dots may have quantum efficiency of greater than or equal to about 10%, for example, greater than or equal to about 30%, greater than or equal to about 50%, greater than or equal to about 60%, greater than or equal to about 70%, greater than or equal to about 90%, or even about 100%. The quantum dots may have a full width at half maximum (FWHM) of emission wavelength spectrum of, for example, less than or equal to about 50 nm, for example less than or equal to about 45 nm, less than or equal to about 40 nm, or less than or equal to about 30 nm.

The quantum dots may have particle sizes (e.g., a diameter or the largest linear length crossing the particle) (for example, an average particle size) of greater than or equal to about 1 nm and less than or equal to about 100 nm. The quantum dots may have a particle size (or an average particle size) of about 1 nm to about 50 nm. The (average) particle size of the quantum dots may be, for example, greater than or equal to about 2 nm, greater than or equal to about 3 nm, greater than or equal to about 4 nm, greater than or equal to about 5 nm, greater than or equal to about 6 nm, greater than or equal to about 7 nm, greater than or equal to about 8 nm, or greater than or equal to about 9 nm. The (average) particle size of the quantum dots may be less than or equal to about 50 nm, less than or equal to about 40 nm, less than or equal to about 30 nm, less than or equal to about 20 nm, or less than or equal to about 15 nm. The shapes of the quantum dots are not particularly limited. For example, the shapes of the quantum dots may be a sphere, an ellipsoid, a polyhedron, a pyramid, a multipod, a square, a rectangular parallelepiped, a nanotube, a nanorod, a nanowire, a nanosheet, or a combination thereof, but are not limited thereto.

The quantum dots may have coordinated organic solvents or organic ligands on the surface during the synthesis process. The specific types of organic solvents and ligand compounds are known. The organic ligands may be bound to the surface of the quantum dots. The organic ligands may include RCOOH, $RNH_2$, $R_2NH$, $R_3N$, RSH, $R_3PO$, $R_3P$, ROH, RCOOR', $RPO(OH)_2$, $R_2POOH$ (wherein, R and R' are each independently a C1 to C40 (e.g., C3-C24), substituted or unsubstituted aliphatic hydrocarbon group such as C1 to C40 alkyl or alkenyl, a C6 to C40 (or C20) substituted or unsubstituted aromatic hydrocarbon group such as a C6 to C20 aryl group), or a combination thereof.

The quantum dot-polymer composite (or the pattern thereof) may have a thickness of greater than or equal to about 6 micrometers (μm), for example, greater than or equal to about 7 μm, or greater than or equal to about 8 μm. The quantum dot-polymer composite (or the pattern thereof) may have a thickness of less than or equal to about 12 μm, for example, less than or equal to about 10 μm.

The quantum dot-polymer composite may have a light absorption rate for excitation light (e.g., blue light) of greater than or equal to about 85%, for example, greater than or equal to about 86%, greater than or equal to about 87%, greater than or equal to about 88%, or greater than or equal to about 89%.

In the quantum dot-polymer composite, a content of the quantum dot may be greater than or equal to about 20 wt %, may be greater than or equal to about 30 wt %, greater than or equal to about 40 wt %, greater than or equal to about 41 wt %, greater than or equal to about 42 wt %, or greater than or equal to about 43 wt % based on a total weight of the composite. The content of the quantum dot may be less than or equal to about 80 wt % for example, less than or equal to about 75 wt %, less than or equal to about 70 wt %, less than or equal to about 69 wt %, less than or equal to about 68 wt %, less than or equal to about 67 wt %, less than or equal to about 66 wt %, less than or equal to about 65 wt %, less than or equal to about 64 wt %, less than or equal to about 63 wt %, less than or equal to about 62 wt %, less than or equal to about 61 wt %, or less than or equal to about 60 wt % based on a total weight of the composite.

In the quantum dot-polymer composite, a content of the quantum dot may be greater than or equal to about 40 wt %, and less than or equal to about 68 wt % or 60 wt %.

The quantum dot-polymer composite pattern of an embodiment may exhibit improved properties as it is produced according to the production method described later, and simultaneously may exhibit a changed chemical composition. Accordingly, the quantum dot-polymer composite may show in Fourier transform infrared spectroscopy a ratio (area ratio) of a hydroxy group peak (e.g., at a wavenumber of approximately 3500 nm) (e.g., also referred to as a first peak) relative to an acrylate peak (e.g., at wavenumber of approximately 1650 nm) (also referred to as a second peak) that is be greater than or equal to about 2.6, greater than or equal to about 2.7, greater than or equal to about 2.8, greater than or equal to about 2.9, greater than or equal to about 3.0, greater than or equal to about 3.1, greater than or equal to about 3.2, greater than or equal to about 3.3, greater than or equal to about 3.4, greater than or equal to about 3.5, or greater than or equal to about 3.6.

In the pattern according to an embodiment, the quantum dot-polymer composite may have an area ratio of a hydroxy group peak (hereinafter, also referred to as a second peak) relative to an aryl group peak (e.g., at a wavenumber of approximately 1400 nm) (hereinafter, also referred to as a third peak) in Fourier transform infrared spectroscopy of greater than or equal to about 10, for example, greater than or equal to about 11, greater than or equal to about 11.5, greater than or equal to about 12, or greater than or equal to about 12.1.

Apparatus for the Fourier transform infrared spectroscopy is commercially available for example, from Agilaent Co. Ltd or Bruker Co., Ltd. From the FTIR spectrum as obtained, the area ratio may be readily obtained for example by using a proper analyzing tool (for example, a commercially available software package such as Varian Resolutions Pro). In an embodiment, the peak area may be calculated by setting a certain peak (e.g., a C=O of an acrylate moiety) as an internal reference and normalizing a stretching band area (for example for an aromatic group) with respect to each sample.

The present inventors have found that the area ratio between the aforementioned peaks in infrared spectroscopy may be confirmed in a pattern produced by the production method described later. The quantum dot-polymer composite pattern produced by the production method described later may exhibit improved luminescence properties (e.g., improved luminance). For example, the quantum dot-polymer composite pattern of an embodiment may have luminous efficiency of greater than or equal to about 33%, greater than or equal to about 34%, or greater than or equal to about 35%. Some process among the production process of the quantum dot-polymer composite pattern based on photolithography (e.g., mixing with a photoresist and heat-treating at a high temperature after exposure/development) may cause various defects on the quantum dot surface. These defects may form a deep trap at the quantum dot light emitting energy level, and luminous efficiency of the quantum dots may be significantly lower than luminous efficiency thereof in a state of a solution (or a dispersion). Without being bound by any theory, after being treated at a high temperature, the quantum dot-polymer composite pattern of an embodiment is placed under a condition of high humidity (e.g., relative humidity of greater than or equal to about 65%, greater than or equal to about 70%, or greater than or equal to about 75%) and a relatively high temperature (e.g., greater than or equal to about 65° C., greater than or equal to about 70° C., or greater than or equal to about 75° C.) for a predetermined time, for example, less than or equal to about 1 hour, and during this after-treatment, defects on the surface of the quantum dots may be minimized, reduced, or removed, and trap emission are therefore also significantly minimized or reduced.

Accordingly, the quantum dot-polymer composite pattern of an embodiment may exhibit a fraction of deep trap emission of less than or equal to about 70%, for example, less than or equal to about 60% for its quantum efficiency (at 77K). In addition, a ratio of deep trap luminous efficiency relative to a quantum yield of the quantum dot-polymer composite of an embodiment is less than or equal to about 0.1. The deep trap emission may be measured using equipment (e.g., HITACHI F7100, Fluorescence spectrophotometer) capable of measuring low temperature photoluminescence (LT-PL).

The quantum dot-polymer composite may further include metal oxide fine particles dispersed in the polymer matrix. The metal oxide fine particles may include $TiO_2$, SiO2, $BaTiO_3$, $Ba_2TiO_4$, ZnO, or a combination thereof. In the quantum dot-polymer composite, a content of the metal oxide fine particles may be less than or equal to about 25 wt %, or less than or equal to about 20 wt %, or less than or equal to about 15 wt % and greater than or equal to about 1 wt %, or greater than or equal to about 5 wt % based on a total weight of the composite. Diameters of the metal oxide fine particles are not particularly limited and may be appropriately selected. The diameters of the metal oxide fine particles may be greater than or equal to about 100 nm, for example greater than or equal to about 150 nm or greater than or equal to about 200 nm and less than or equal to about 1000 nm, or less than or equal to about 800 nm.

The quantum dot-polymer composite may include greater than or equal to about 40% and less than or equal to about 60% of the quantum dot, greater than or equal to about 4% and less than or equal to about 15% of the metal oxide fine particles, and a balance of the polymer matrix based on a total weight of the quantum dot-polymer composite, but is not limited thereto.

In another embodiment as represented in FIG. 1, a method of producing the aforementioned quantum dot-polymer composite pattern includes obtaining a film of a composition including a linear polymer including a carboxylic acid group-containing repeating unit, a plurality of cadmium-free quantum dots, an ethylenic unsaturated monomer, a thiol compound having at least two thiol (—SH) groups, a photoinitiator, and optionally metal oxide fine particles (S1); exposing the film to light (e.g., having a wavelength of less than or equal to about 420 nm) under a mask having a predetermined pattern (S2); contacting the film exposed to the light with an alkali developing solution to dissolve and remove the unexposed portion of the film to obtain a pattern (S3 and S4); heat-treating the pattern at a temperature of greater than or equal to about 180° C. for greater than or equal to about 10 minutes (S5); and placing the heat-treated pattern under a condition of a temperature of greater than or equal to about 65° C. and a relative humidity of greater than or equal to about 65% for greater than or equal to about 10 minutes and less than or equal to about 1 hour.

Details for the linear polymer including the carboxylic acid group-containing repeating unit, the plurality of cadmium-free quantum dots, the ethylenic unsaturated monomer, the thiol compound having at least two thiol (—SH) groups, and the metal oxide fine particles are the same as described above.

The types of the photoinitiator (or photopolymerization initiator) are not particularly limited and may be appropriately selected. Examples of the photopolymerization initiator may include a triazine-based compound, an acetophenone-based compound, a benzophenone-based compound, a thioxanthone-based compound, a benzoin-based compound, an oxime-based compound, a carbazole-based compound, a diketone series compound, a sulfonium borate-based compound, a diazo-based compound, a biimidazole-based compound, or a combination thereof, but are not limited thereto. A content of the photoinitiator may be greater than or equal to about 0.01 wt %, for example, greater than or equal to about 0.1 wt %, or greater than or equal to about 1 wt % based on a total weight of a solid content.

The film may be obtained by coating organic dispersion (or organic solution) including the aforementioned components in a desired thickness on a substrate using a suitable method such as a spin coating, a slit coating, and the like. The organic dispersion (or organic solution) may include an organic solvent and may have a predetermined solid content (e.g., greater than or equal to about 10%, greater than or equal to about 15%, or greater than or equal to about 20% and less than or equal to about 70%, less than or equal to about 60%, less than or equal to about 50%, less than or equal to about 40%, or less than or equal to about 30%). The organic dispersion may include an organic solvent in a residual amount except for a desired amount of the (non-volatile) solid. The organic solvent may be appropriately selected by considering affinity for other components in the composition (e.g., the binder, photopolymerizable monomer, photoinitiator, or other additives), affinity for an alkali developing solution, and a boiling point. Examples of the organic solvent may include ethyl 3-ethoxy propionate; ethylene glycols such as ethylene glycol, diethylene glycol, polyethylene glycol, and the like; glycolethers such as ethylene glycolmonomethylether, ethylene glycolmonoethylether, diethylene glycolmonomethylether, ethylene glycoldiethylether, diethylene glycoldimethylether, and the like; glycolether acetates such as ethylene glycol acetate, ethylene glycolmonoethylether acetate, diethylene glycolmonoethylether acetate, diethylene glycolmonobutylether acetate, and the like; propylene glycols such as propylene glycol, and the like; propylene glycolethers such as propylene glycolmonomethylether, propylene glycolmonoethylether, propylene glycolmonopropylether, propylene glycolmonobutylether, propylene glycoldimethylether, dipropylene glycoldimethylether, propylene glycoldiethylether, dipropylene glycoldiethylether, and the like; propylene glycolether acetates such as propylene glycolmonomethyl ether acetate, dipropylene glycolmonoethylether acetate, and the like; amides such as N-methylpyrrolidone, dimethyl formamide, dimethyl acetamide, and the like; ketones such as methylethylketone (MEK), methylisobutylketone (MIBK), cyclohexanone, and the like; petroleums such as toluene, xylene, solvent naphtha, and the like; esters such as ethyl acetate, butyl acetate, ethyl lactate, and the like; ethers such as diethyl ether, dipropyl ether, dibutyl ether, and the like, or a mixture thereof.

The formed film may be subjected to pre-baking, optionally at a predetermined temperature (e.g. at a temperature near a boiling point of the used solvent). The pre-baking temperature, time and atmosphere may be appropriately selected. (refer to S2 of FIG. 1)

The formed (or optionally pre-baked) film is exposed to light having a predetermined wavelength under a mask having a predetermined pattern. The wavelength and intensity of the light may be selected in consideration of types and contents of the photoinitiator and types and contents of the quantum dots.

When the exposed film is treated (e.g., dipped or sprayed) with an alkali developing solution, the unexposed portion in the film is dissolved to provide a desirable pattern. The alkali developing solution may be an aqueous solution (e.g., a potassium hydroxide aqueous solution, a sodium hydroxide aqueous solution, etc.) having pH of greater than or equal to about 8, greater than or equal to about 9, greater than or equal to about 10, or greater than or equal to about 11 and less than or equal to about 13, or less than or equal to about 12.

The obtained pattern may be post-baked at a temperature of greater than or equal to about 180° C. (e.g., greater than or equal to about 180° C. and less than or equal to about 230° C.) for a predetermined time (e.g., greater than or equal to about 10 minutes, or greater than or equal to about 20 minutes). This post-bake process is necessary to form the desired pattern, but according to studies of the present inventors, deep trap emission of the quantum dot-polymer composite pattern may be greatly increased and may have a significant negative impact on luminance.

The quantum dot-polymer composite pattern may optionally include two or more sections. For example, a quantum dot-polymer composite pattern having a plurality of sections may be obtained by preparing two or three types of compositions respectively including red quantum dots or green quantum dots (or optionally, blue quantum dots) and repeating the aforementioned patterning process as many times as needed (e.g., about twice or more or three times or more). (S6)

In an embodiment, the quantum dot-polymer composite pattern after the post-baking process is placed under a condition of a relatively high temperature and a relatively humid for greater than or equal to about 10 minutes (e.g., greater than or equal to about 20 minutes) and less than or equal to about 1 hour (e.g., less than or equal to about 50 minutes). (Hereinafter, it is also referred to as a hydrothermal treatment process.)

In an embodiment, the hydrothermal treatment may be performed at greater than or equal to about 65° C., greater than or equal to about 70° C., greater than or equal to about 75° C., greater than or equal to about 80° C., or greater than or equal to about 85° C. In an embodiment, the hydrothermal treatment may be performed under relative humidity of greater than or equal to about 65%, greater than or equal to about 70%, greater than or equal to about 75%, greater than or equal to about 80%, or greater than or equal to about 85%.

By hydrothermal treatment, the quantum dot-polymer composite may exhibit a changed infrared spectrum, which is the same as illustrated above.

In another embodiment, a display device includes a light source and a light emitting element (e.g., photoluminescence element), wherein the light emitting element includes the aforementioned quantum dot-polymer composite, and the light source is configured to provide the light emitting element with incident light. The incident light may have a peak wavelength in a range of greater than or equal to about 440 nm, for example, greater than or equal to about 450 nm and less than or equal to about 460 nm. The incident light may be third light.

The light source may include a plurality of light emitting units respectively corresponding to the first section and the second section, and the light emitting units may include a first electrode and a second electrode facing each other and an electroluminescent layer disposed between the first electrode and the second electrode. The electroluminescent layer may include an organic light emitting material. For example, each light emitting unit of the light source may include an electroluminescent device (e.g., an organic light emitting diode (OLED)) structured to emit light of a predetermined wavelength (e.g., blue light, green light, or a combination thereof). Structures and materials of the electroluminescent device (e.g., the organic light emitting diode (OLED)) are known but not particularly limited. The display device according to embodiments may be configured to have color reproducibility of greater than or equal to about 80% based on BT2020.

Figure 2A:
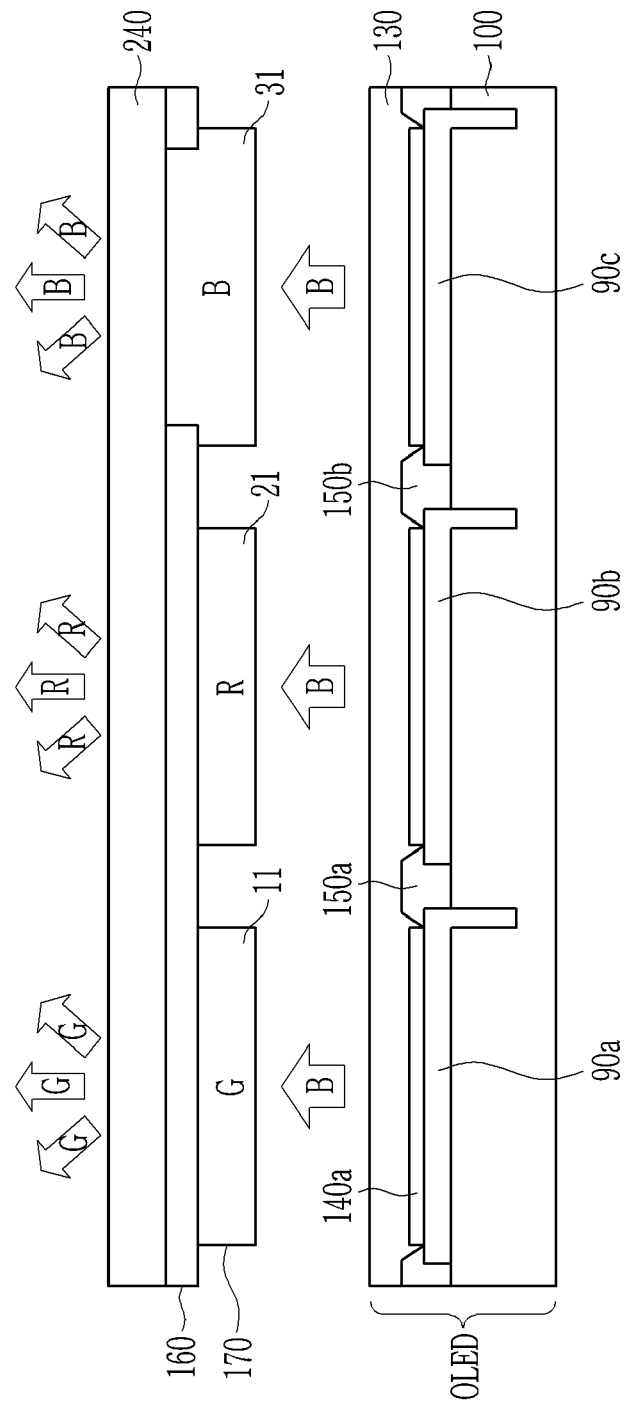
FIGS. 2A and 2B are schematic cross-sectional views of a display device according to another embodiment.
Figure 2B:
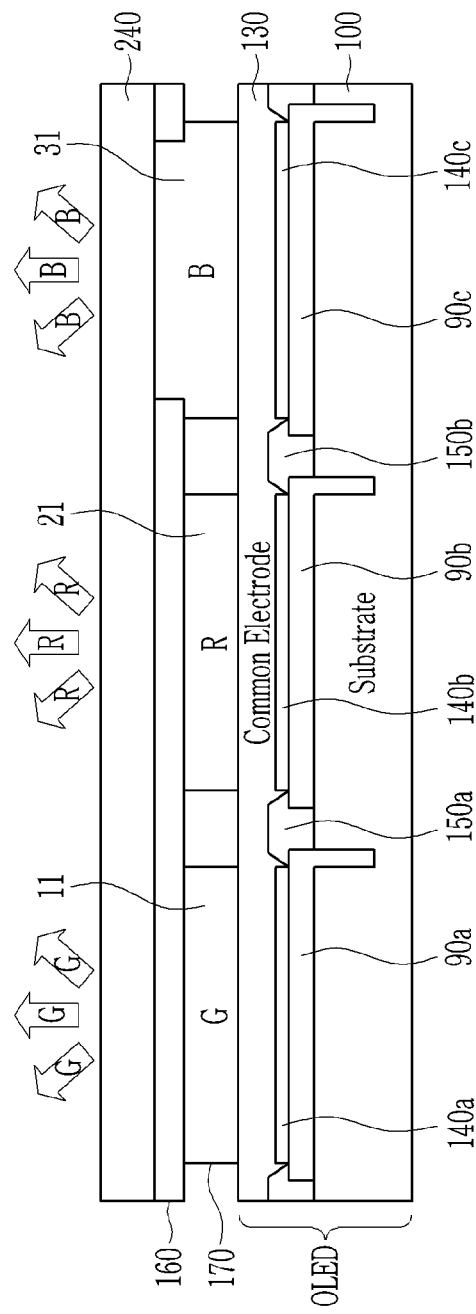

FIGS. 2A and 2B are schematic cross-sectional views of display devices according to embodiments. Referring to FIGS. 2A and 2B, a light source may include an organic light emitting diode (OLED) (e.g., emitting blue light or light in a wavelength of less than or equal to about 500 nm). Referring to FIGS. 2A and 2B, a light source includes an organic light emitting diode (OLED) emitting blue light. The organic light emitting diode OLED may include (at least two, for example, three or more) pixel electrodes 90a, 90b, 90c formed on a substrate 100, a pixel defining layer 150a, 150b formed between the adjacent pixel electrodes 90a, 90b, 90c, an organic light emitting layer 140a, 140b, 140c formed on the pixel electrodes 90a, 90b, 90c, and a common electrode layer 130 formed on the organic light emitting layer 140a, 140b, 140c.

A thin film transistor and a substrate may be disposed under the organic light emitting diode (OLED). Details of the organic light emitting diode (OLED) are the same as described above. The pixel areas of the organic light emitting diode (OLED) may be disposed corresponding to first, second and third sections which will be described later.

A stack structure of the quantum dot-polymer composite pattern (e.g., including a G section including green quantum dots and an R section including red quantum dots) and a substrate, or the quantum dot-polymer composite pattern may be disposed on the light source (e.g., directly on the light source).

The light (e.g., blue light) emitted from the light source may enter the second section 21 and the first section 11 of the quantum dot-polymer composite pattern 170 to emit (e.g., converted) red light R and green light G, respectively. The blue light B emitted from the light source passes through or transmits from the third section 31.

Over the second section 21 emitting red light, the first section 11 emitting green light, or a combination thereof, an optical element 160 may be disposed. The optical element may be a blue cut layer which cuts (e.g., reflects or absorbs) blue light and optionally green light, or a first optical filter layer 310 (see FIG. 3). The blue cut layer or optical element 160 may be disposed on the upper substrate 240. The blue cut layer 160 may be disposed under the upper substrate 240 (e.g., on a bottom surface of the upper substrate 240). The blue cut layer 160 may be disposed between the upper substrate 240 and the quantum dot-polymer composite pattern and over the first section 11 and the second section 21. Details of the blue cut layer are the same as set forth for the first optical filter layer 310 below.

The display device may be obtained by separately fabricating the stack structure and (e.g., blue light emitting) LED or OLED and then assembling the same. Alternatively, the display device may be obtained by forming a quantum dot-polymer composite pattern directly on the LED or OLED.

In an embodiment, the display device may further include a lower substrate 210, an optical element (e.g., polarizer) 300 disposed below the lower substrate 210, and a liquid crystal layer 220 interposed between the stacked structure and the lower substrate 210. The stacked structure may be disposed in such a manner that a light emitting layer (i.e., the quantum dot-polymer composite pattern) faces the liquid crystal layer. The display device may further include an optical element (e.g., polarizer) 300 between the liquid crystal layer 220 and the photoluminescent (light emitting) layer. The light source may further include an LED and optionally a light guide panel.

Figure 3:
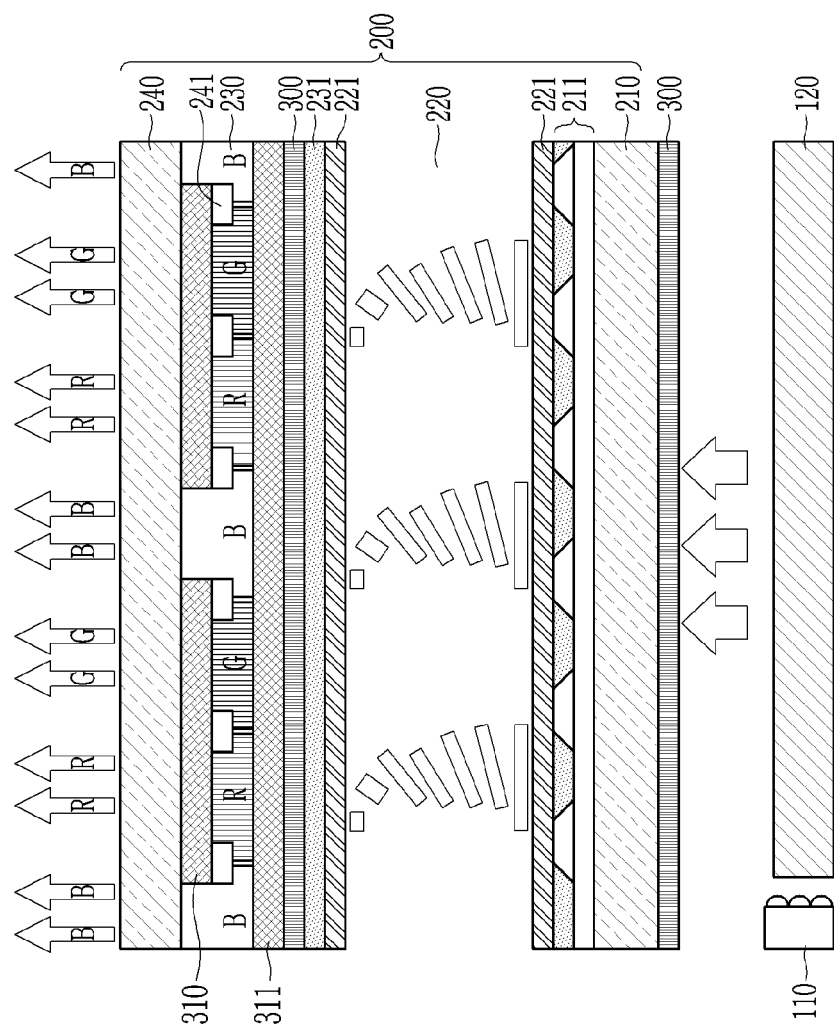
FIG. 3 is a schematic cross-sectional view of a display device according to another embodiment.

Referring to FIG. 3, in a non-limiting embodiment, the display device includes a backlight unit including a liquid crystal panel 200, an optical element 300 (e.g. polarizing plate) disposed on and/or under the liquid crystal panel 200, and a light source emitting blue light which is disposed under the bottom optical element 300. The backlight unit may include a light source 110 and a light guide panel 120 (edge-type). The backlight unit may be a direct lighting without a light guide panel (not shown). The liquid crystal panel 200 may include a lower substrate 210, an upper substrate 240, a liquid crystal layer 220 disposed between the upper and lower substrates, and a color filter layer 230 disposed on the upper surface or the bottom surface of the upper substrate 240. The color filter layer (also can be referred to as photoluminescent layer) 230 may include the aforementioned quantum dot-polymer composite (or the pattern thereof).

A wire plate 211 may be provided on the inner surface, for example, the upper surfaces of the lower substrate 210. The wire plate 211 may include a plurality of gate wires (not shown) and data wires (not shown) that define a pixel area, a thin film transistor disposed adjacent to a crossing region of gate wires and data wires, and a pixel electrode for each pixel area, but is not limited thereto. Details of such a wire plate are known and are not particularly limited.

The liquid crystal layer 220 may be disposed on the wire plate 211. The liquid crystal layer 220 may include an alignment layer 221 on and under the liquid crystal layer 220 to initially align the liquid crystal material included therein. Details (e.g., a liquid crystal material, an alignment layer material, a method of forming liquid crystal layer, a thickness of liquid crystal layer, or the like) of the liquid crystal material and the alignment layer are known and are not particularly limited.

An upper optical element or an upper polarizer 300 may be provided between the liquid crystal layer 220 and the upper substrate 240, but is not limited thereto. For example, the upper polarizer may be disposed between the liquid crystal layer 220 or the common electrode 231 and the photoluminescent layer 230 (or the quantum dot-polymer composite pattern). In an embodiment, the optical element 300 may be a polarizer. A black matrix 241 is provided on the upper substrate (e.g., the bottom surface thereof) and has openings and hides a gate line, a data line, and a thin film transistor of the wire plate on the lower substrate. A second color filter (R) configured to emit red light, a first color filter (G) configured to emit green light and/or a third color filter (B) configured to emit (and/or transmit) blue light may be disposed in the openings of the black matrix 241. For example, the black matrix 241 may have a lattice shape. If needed, the photoluminescent layer may further include at least one fourth section. The fourth section may be configured to emit light of a different color from light emitted from the first to third sections (e.g., cyan, magenta, and yellow light).

The color filter layer 230 may be disposed on the transparent common electrode 231.

If desired, the display device may further include a blue light blocking layer (hereinafter, also referred to as a first optical filter layer). The blue light blocking layer may be disposed between bottom surfaces of the R section and the G section and the upper substrate 240 or on the upper surface of the upper substrate 240. The blue light blocking layer may include a sheet having openings that correspond to a pixel area showing a blue color (e.g., third section) and may be formed on portions corresponding to the R and G sections. The first optical filter layer may be integrally formed as one body structure at the remaining positions except positions overlapped with the B section, but is not limited thereto. At least two first optical filter layers may be spaced apart and be disposed at each of the positions overlapped with the R and G sections.

For example, the first optical filter layer may block light having a portion of a wavelength region in the visible light region and transmit light having other wavelength regions. For example, the first optical filter layer may block blue light and transmit light except blue light. For example, the first optical filter layer may transmit green light, red light, and/or yellow light that is mixed light thereof.

The first optical filter layer may include a polymer thin film including a dye and/or a pigment that absorbs light having a wavelength to be blocked. The first optical filter layer may block at least 80%, or at least 90%, even at least 95% of blue light having a wavelength of less than or equal to about 480 nm and it may have light transmittance of greater than or equal to about 70%, greater than or equal to about 80%, greater than or equal to about 90%, or even about 100% with respect to other visible light of greater than about 500 nm and less than or equal to about 700 nm.

The first optical filter layer may absorb blue light of less than or equal to about 500 nm and substantially block it, but may for example selectively transmit green light or red light.

In this case, at least two first optical filter layers may be spaced apart and disposed at each of the positions overlapped with the R and G sections, respectively. For example, a first optical filter layer selectively transmitting red light may be disposed at the position overlapped with the section emitting red light and the first optical filter layer selectively transmitting green light may be disposed at the position overlapped with the section emitting green light, respectively.

For example, the first optical filter layer may include at least one of a first region and a second region wherein the first region blocks (e.g., absorb) blue light and red light and transmits light having a wavelength of a predetermined range (e.g., greater than or equal to about 500 nm, greater than or equal to about 510 nm, or greater than or equal to about 515 nm and less than or equal to about 550 nm, less than or equal to about 540 nm, less than or equal to about 535 nm, less than or equal to about 530 nm, less than or equal to about 525 nm, or less than or equal to about 520 nm) and the second region blocks (e.g., absorb) blue light and green light and transmits light having a wavelength of predetermined ranges (e.g., greater than or equal to about 600 nm, greater than or equal to about 610 nm, or greater than or equal to about 615 nm and less than or equal to about 650 nm, less than or equal to about 640 nm, less than or equal to about 635 nm, less than or equal to about 630 nm, less than or equal to about 625 nm, or less than or equal to about 620 nm). The first region may be disposed at the position overlapped with the section emitting green light and the second region may be disposed at the position overlapped with the section emitting red light. The first region and the second region may be optically isolated by for example, black matrixes and the like. The first optical filter layer may contribute to improving color purity of a display device.

The first optical filter layer may be a reflective filter including a plurality of layers (e.g., inorganic material layers) with different refractive index. For example, two layers having different refractive index may be alternately stacked with each other, or for example, a layer having a high refractive index and a layer having a low refractive index may be alternately stacked with each other.

The display device may further include a second optical filter layer 311 (e.g., red/green or yellow light recycling layer) disposed between the photoluminescent layer and the liquid crystal layer (e.g., between photoluminescent layer and upper polarizer) and transmitting at least a portion of the third light and reflecting at least a portion of the first light and the second light. The second optical filter layer may reflect light in a wavelength region of greater than about 500 nm. The first light may be green (or red) light, the second light may be red (or green) light, and the third light may be blue light.

Another embodiment provides an electronic device including the aforementioned quantum dot-polymer composite (or the pattern thereof). The device may include a light emitting diode (LED), an organic light emitting diode (OLED), a sensor, a solar cell, an imaging sensor, or a liquid crystal display (LCD), but is not limited thereto.

Hereinafter, the embodiments are illustrated in more detail with reference to examples. However, they are exemplary embodiments of the present invention, and the present invention is not limited thereto.

EXAMPLES

Measurement Methods:
Analysis Methods
[1] Luminous Efficiency
A composite film is put in an integrating sphere and irradiated by excitation light of a wavelength of 450 nm, and then, luminous efficiency of the composite film is measured.
[2] Fourier transform Infrared Spectroscopy
Fourier transform infrared spectroscopy is performed with respect to the obtained pattern by using an infrared spectrometric analyzer Vertex70-Hyperion3000 from Bruker Co. Ltd. or Varian 670 IR from Agilent Co., Ltd.
[3] Trap Emission and Low Temperature Photoluminescence
A deep trap emission and a measurement at a temperature of 77K are performed by a fluorescence spectrophotometer (Hitachi, F7100).

Reference Example 1: Production of Non-Cadmium Quantum Dots (1) 0.2 millimole (mmol) of indium acetate, 0.6 mmol of palmitic acid, and 10 milliliters (mL) of 1-octadecene are put in a reactor and heated at 120° C. under vacuum. The atmosphere in the reactor is exchanged with nitrogen after one hour. After heating the mixture at 280° C., a mixed solution of 0.1 mmol of tris(trimethylsilyl)phosphine (TMS3P) and 0.5 mL of trioctylphosphine is rapidly added to the reactor and reacted for 20 minutes. The reaction solution is rapidly cooled to room temperature and acetone is added, and the product mixture is centrifuged to provide a precipitate, and the precipitate is dispersed in toluene. The obtained InP semiconductor nanocrystal exhibits a ultraviolet (UV) first absorption maximum wavelength of 420 nanometers (nm) to 600 nm.

0.3 mmol (0.056 grams (g)) of zinc acetate, 0.6 mmol (0.189 g) of oleic acid, and 10 mL of trioctylamine are put in a reaction flask and vacuum-treated at 120° C. for 10 minutes. The inside of the reaction flask is substituted with Nitrogen ($N_2$) and heated up to 220° C. The toluene dispersion (OD: 0.15) of the InP semiconductor nanocrystal and a predetermined amount of S/TOP are added to the reaction flask and then, heated up to 280° C. and reacted for 30 minutes. When the reaction is complete, the reaction solution is rapidly cooled down to room temperature to obtain a reaction product including the InP/ZnS semiconductor nanocrystal.

(2) An excessive amount of ethanol is added to the reaction product including the InP/ZnS semiconductor nanocrystal, and then, the mixture is centrifuged. Following centrifugation, the supernatant is removed or separated and the resulting precipitate is dried and dispersed in chloroform or toluene to obtain a quantum dot solution (hereinafter, QD solution). A UV-vis absorption spectrum of the obtained QD solution is measured. The produced quantum dots emit light at a wavelength of approximately 530 nm.

Example 1

[1] The chloroform dispersion solution of the quantum dots according to Reference Example 1 is mixed with a binder (a quaternary copolymer of methacrylic acid, benzyl methacrylate, hydroxyethylmethacrylate, and styrene, acid value: 130 mg KOH/g, molecular weight: 8000, methacrylic acid:benzylmethacrylate:hydroxyethylmethacrylate:styrene (a mole ratio)=61.5%:12%:16.3%:10.2%) solution (polypropylene glycol monomethyl ether acetate at a concentration of 30 weight percent (wt %)) to prepare a quantum dot-binder dispersion. In the quantum dot-binder dispersion, the quantum dots are uniformly dispersed, when examined and observed with naked eyes.

[2] In the quantum dot binder dispersion, glycoldi-3-mercaptopropionate having the following structure (hereinafter, 2T), hexa-acrylate having the following structure as a photopolymerizable monomer, an oxime ester compound as an initiator, the metal oxide fine particle, and PGMEA are mixed to prepare a composition (a total solid content of the composition: 25%).

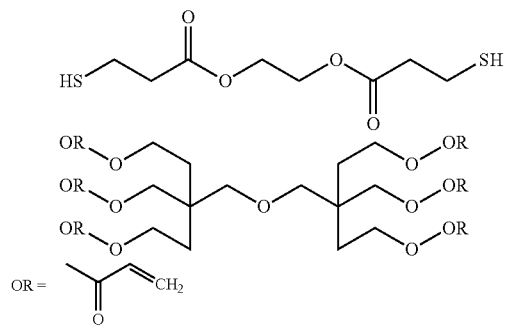

The prepared composition includes 43 wt % of the quantum dots, 10 wt % of a binder, 12 wt % of a photopolymerizable monomer, 0.5 wt % of an initiator, 9.5 wt % of titanium oxide fine particles, and 25 wt % of 2T, each of which is based on a total solid content of the composition. A total solid content of the composition is 25 wt %.

[3] The composition is spin-coated on a glass substrate at 180 revolutions per minute (rpm) for 5 seconds to obtain a film. The film is pre-baked (PrB) at 100° C. The pre-baked film is irradiated by light (wavelength: 365 nm, intensity: 100 millijoules (mJ)) for one second under a mask having a predetermined pattern and developed in a potassium hydroxide aqueous solution (concentration: 0.043 wt %, pH: 11) for 50 seconds to obtain a pattern (line width: 100 micrometers (um)). The obtained pattern is heat-treated (post-baked, PoB) at 180° C. for 30 minutes. The heat-treated pattern is hydrothermally treated (HT) in a chamber under relative humidity of 85% and a temperature of 85° C. for 10 minutes.

The pre-bake film, the pattern after PoB, and the pattern after HT are measured with respect to luminous efficiency, and the results are shown in Table 1.

Before and after HT, infrared spectroscopy is performed, and a ratio of an OH peak (wavenumber: 3500 nm) relative to an acrylate peak (wavenumber: 1650 nm) and a ratio of the OH peak relative to an aromatic peak (wavenumber: 1400 nm) before and after the treatment are shown in Table 2.

Figure 4:
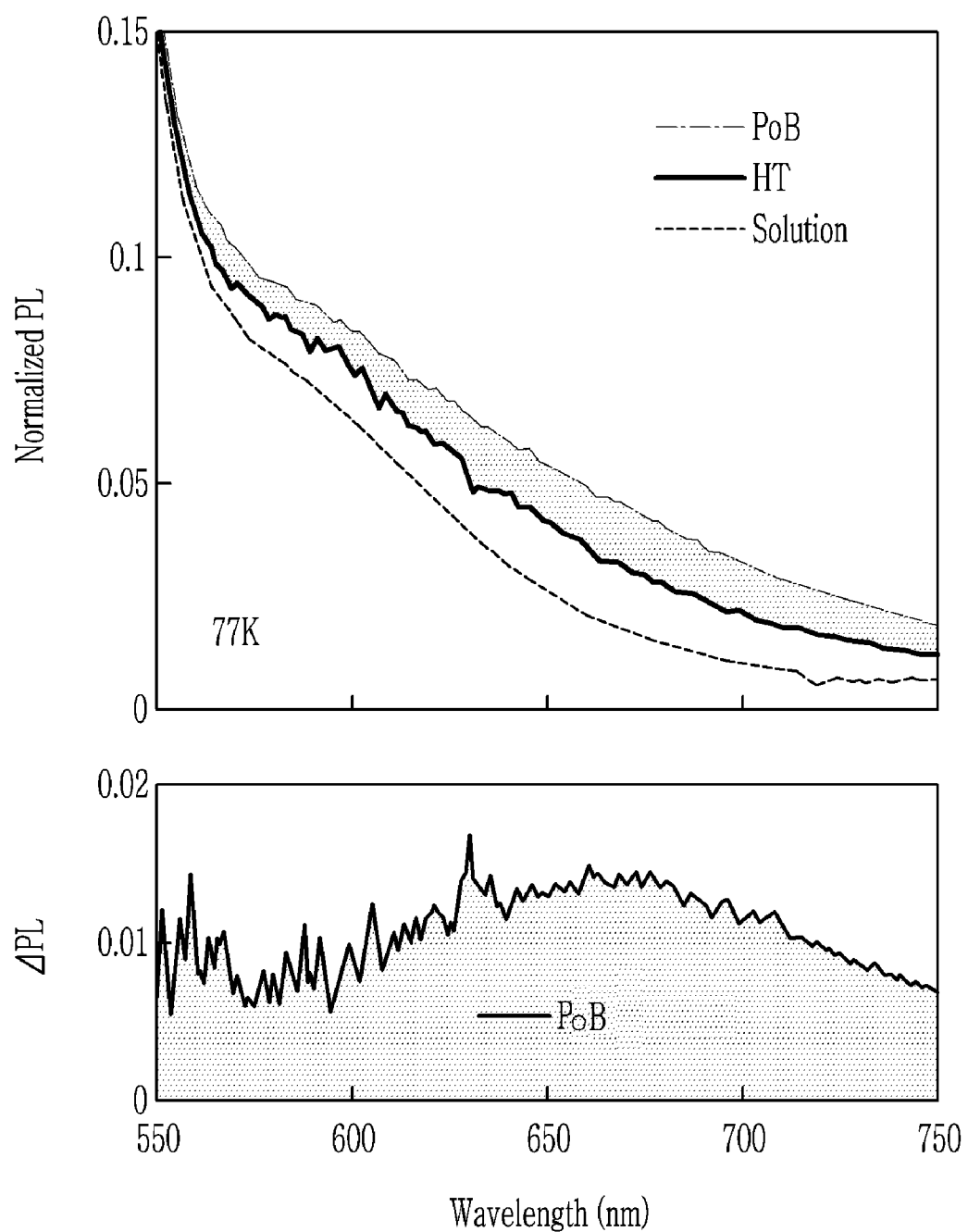
FIG. 4 shows trap emission at 77K for the quantum dot-polymer composite pattern produced in Example 1, for each of the quantum dot dispersion solution, the quantum dot-polymer composite pattern after PoB, and the quantum dot-polymer composite pattern after HT treatment.

[4] The quantum dot dispersion solution according to Reference Example 1 and the quantum dot-polymer composite (after PoB and HT) according to Example 1 are measured with respect to generation of a deep trap, and the results are shown in FIG. 4. Referring to the results of FIG. 4, the increased deep trap emission of the quantum dot-polymer composite after FOB may be reduced by the hydrothermal treatment.

Example 2

A composition is prepared according to the same method as Example 1 except that 26 wt % of the quantum dots, 20 wt % of the binder, 19 wt % of the photopolymerizable monomer, 0.5 wt % of the initiator, 9.5 wt % of the titanium oxide fine particles, and 25 wt % of 2T based on a total amount of a solid of the composition are used, and a quantum dot-polymer composite pattern is formed by using the same.

The pre-baked film, the pattern after PoB, and the pattern after HT are measured with respect to luminous efficiency, and the results are shown in Table 1.

Infrared spectroscopy after HT is performed, and a ratio of an OH peak (wavenumber: about 3500 $cm^{-1}$) relative to an acrylate peak (wavenumber: about 1650 $cm^{-1}$) and a ratio of the OH peak relative to an aromatic peak (wavenumber: about 1400 $cm^{-1}$) before and after the treatment are calculated, and the results are shown in Table 2. The ratio of peaks refers to the measurement of peak area for each of the OH, acrylate, and aromatic peaks at the respective stated wavenumber in the transmission spectrum using Varian Resolutions Pro (a commercially-available software for analyzing the FTIR spectrum).

TABLE 1

|  | Luminous efficiency (%) | | |
| --- | --- | --- | --- |
|  | After PrB | After PoB | After HT |
| Example 1 | 29 | 30 | 32 |
| Example 2 | 17 | 16 | 18 |

Referring to the results of Table 1, luminous efficiency reduced by the PoB treatment is greatly improved by the HT treatment.

TABLE 2

|  | OH peak relative to aromatic peak | | OH peak relative to acrylate peak | |
| --- | --- | --- | --- | --- |
|  | Before HT treatment | After HT treatment | Before HT treatment | After HT treatment |
| Example 1 | 8.45 | 12.18 | 2.41 | 3.66 |
| Example 2 | 7.39 | 8.89 | 2.1 | 2.67 |

Referring to the results of Table 2, the quantum dot-polymer composites according to Examples 1 and 2 exhibit an increased OH peak ratio after the HT treatment relative to that before the HT treatment.

Examples 3-1 to 3-4

Each quantum dot-polymer composite pattern is formed according to the same method as Example 1, except that 51 wt % of the quantum dots, 10 wt % of the binder, 9.3 wt % of the photopolymerizable monomer, 0.2 wt % of the initiator, 4.5 wt % of the titanium oxide fine particles, and 25 wt % of 2T based on a total solid amount thereof are used to prepare a composition, and the hydrothermal treatment is performed under a condition of 65° C. (temp.) and 65% (RH) (Example 3-1); 75° C.(temp.) and 75% (RH) (Example 3-2); 85° C.(temp.) and 85% (RH) (Example 3-3); and 95° C.(temp.) and 95% (RH) (Example 3-4).

A pattern after PoB and a pattern after the HT treatment are measured with respect to luminous efficiency, and the results are shown in Table 3.

As for the patterns of Examples 3-1, 3-2, and 3-4, infrared spectroscopy before and after the HT treatment is performed, and then, a ratio of an OH peak (wavenumber: 3500 nm) relative to an acrylate peak (wavenumber: 1650 nm) and a ratio of the OH peak relative to an aromatic peak (wavenumber: 1400 nm) before and after the treatment are calculated, and the results are shown in Table 4.

TABLE 3

|  | QE after PoB | QE after HT |
|---|---|---|
| Example 3-1 | about 31(%) | 33.8% |
| Example 3-2 |  | 34.2% |
| Example 3-3 |  | 34.8% |
| Example 3-4 |  | 34.9% |

Referring to the results of Table 3, luminous efficiency after PoB is not reduced (or may be increased) by the HT treatment.

TABLE 4

|  | OH peak relative to aromatic peak | OH peak relative to acrylate peak |
|---|---|---|
| Before HT treatment | 8.62 | 2.44 |
| Example 3-1 (6565 condition) | 11.67 | 3.5 |
| Example 3-2 (7575 condition) | 12.95 | 3.89 |
| Example 3-4 (9595 condition) | 15.82 | 4.75 |

Referring to the results of Table 4, an OH peak ratio increased after the HT treatment relative to that before the HT treatment is shown.

While this disclosure has been described in connection with what is presently considered to be practical example embodiments, it is to be understood that the invention is not limited to the disclosed embodiments. On the contrary, it is intended to cover various modifications and equivalent arrangements included within the spirit and scope of the appended claims.

What is claimed is:

1. A quantum dot-polymer composite pattern, comprising a repeating section configured to emit light of a predetermined wavelength,
    wherein the quantum dot-polymer composite comprises a polymer matrix comprising a linear polymer comprising a carboxylic acid group-containing repeating unit, and a plurality of cadmium-free quantum dots dispersed in the polymer matrix,
    wherein the quantum dot-polymer composite has a light absorption rate of greater than or equal to about 85% at wavelength of 450 nanometers, and
    wherein the quantum dot-polymer composite further comprises metal oxide fine particles dispersed in the polymer matrix, and
    wherein in the quantum dot-polymer composite, an amount of the quantum dots is greater than or equal to about 40 weight percent and less than or equal to about 80 weight percent, and an amount of the metal oxide fine particles is greater than or equal to about 4 weight percent and less than or equal to about 15 weight percent, based on a total weight of the quantum dot-polymer composite.

2. The quantum dot-polymer composite pattern of claim 1, wherein the repeating section comprises a first section configured to emit first light, a second section configured to emit a second light that is different from the first light, or a combination thereof.

3. The quantum dot-polymer composite pattern of claim 2, wherein a maximum peak wavelength of the first light is in a range of greater than about 580 nanometers and less than or equal to about 680 nanometers, and a maximum peak wavelength of the second light is in a range of greater than about 480 nanometers and less than or equal to about 580 nanometers.

4. The quantum dot-polymer composite pattern of claim 1, wherein the linear polymer has an acid value of greater than or equal to about 50 mg KOH/g and less than or equal to about 250 mg KOH/g.

5. The quantum dot-polymer composite pattern of claim 1, wherein
    the linear polymer comprises a copolymer of a monomer mixture comprising a first monomer comprising a carboxylic acid group and a carbon-carbon double bond, a second monomer having a carbon-carbon double bond and a hydrophobic moiety and not comprising a carboxylic acid group, and optionally a third monomer having a carbon-carbon double bond and a hydrophilic moiety and not comprising a carboxylic acid group;
    a multiple aromatic ring-containing polymer having a backbone structure in which two aromatic rings in a main chain are bonded with a quaternary carbon atom of another cyclic moiety, the multiple aromatic ring-containing polymer comprising a carboxyl group; or
    a combination thereof.

6. The quantum dot-polymer composite pattern of claim 5, wherein
    the first monomer comprises carboxylic acid vinyl ester,
    the second monomer comprises an alkenyl aromatic compound $R^1OCOCR=CR2$ wherein $R^1$ is a C1 to C10 alkyl, a C1 to C10 aminoalkyl, a C6 to C30 aryl, a C7 to C30 alkylaryl, or a C3 to C30 cycloalkyl and each R is the same or different and is each independently hydrogen, a C1 to C10 alkyl, or a combination thereof, maleimide, a (meth)acrylate comprising a glycidyl group, a vinyl cyanide compound, (meth)acrylamide, or a combination thereof, and
    the third monomer comprises hydroxyalkyl (meth)acrylate.

7. The quantum dot-polymer composite pattern of claim 1, wherein the polymer matrix further comprises a crosslinked polymer.

8. The quantum dot-polymer composite pattern of claim 7, wherein the crosslinked polymer comprises a thiolene resin, a crosslinked poly(meth)acrylate, a crosslinked polyurethane, a crosslinked epoxy resin, a crosslinked vinyl polymer, a crosslinked silicone resin, or a combination thereof.

9. The quantum dot-polymer composite pattern of claim 7, wherein the crosslinked polymer comprises a polymerization product of a monomer combination of an ethylenic unsaturated monomer comprising a (meth)acrylate monomer, a vinyl monomer, or a combination thereof and a thiol compound having at least two thiol (-SH) groups.

10. The quantum dot-polymer composite pattern of claim 1, wherein the polymer matrix does not comprise an organic siloxane moiety.

11. The quantum dot-polymer composite pattern of claim 1, wherein the quantum dot-polymer composite has a thickness of greater than or equal to about 6 micrometers.

12. The quantum dot-polymer composite pattern of claim 1, wherein the quantum dot-polymer composite has a light absorption rate of greater than or equal to about 89%.

13. The quantum dot-polymer composite pattern of claim 1, wherein a content of the quantum dot in the quantum dot-polymer composite is greater than or equal to about 41 weight percent based on a total weight of the quantum dot-polymer composite.

14. The quantum dot-polymer composite pattern of claim 1, wherein the quantum dot-polymer composite has an area ratio of a hydroxy peak relative to an acrylate peak is greater than or equal to about 3.0 in Fourier transform infrared spectroscopy, and wherein the quantum dot-polymer composite has an area ratio of a hydroxy peak relative to an aryl group peak of greater than or equal to about 10, as measured by a Fourier transform infrared spectroscopy of the quantum dot-polymer composite.

15. The quantum dot-polymer composite pattern of claim 1, wherein the quantum dot-polymer composite has an area ratio of a hydroxy peak relative to an acrylate peak is greater than or equal to about 2.6, and an area ratio of a hydroxy peak relative to an aryl group peak of greater than or equal to about 10 as measured by a Fourier transform infrared spectroscopy of the quantum dot-polymer composite.

16. The quantum dot-polymer composite pattern of claim 1, wherein an area ratio of a hydroxy peak relative to an aryl group peak is greater than or equal to about 12 as measured by a Fourier transform infrared spectroscopy of the quantum dot-polymer composite.

17. The quantum dot-polymer composite pattern of claim 1, wherein the quantum dot-polymer composite has luminous efficiency of greater than or equal to about 33%.

18. The quantum dot-polymer composite pattern of claim 1, wherein the quantum dot-polymer composite further comprises a ratio of deep trap luminous efficiency relative to a quantum yield of less than or equal to about 0.1.

19. The quantum dot-polymer composite pattern of claim 1, wherein in the quantum dot-polymer composite the amount of the quantum dots is less than or equal to about 60 weight percent, based on a total weight of the quantum dot-polymer composite.

20. A method of producing a quantum dot-polymer composite pattern, comprising obtaining a film of a composition comprising a linear polymer comprising a carboxylic acid group-containing repeating unit, a plurality of cadmium-free quantum dots, an ethylenic unsaturated monomer, a thiol compound having at least two thiol (-SH) groups, a photoinitiator, and optionally metal oxide fine particles;

exposing the film to light of less than or equal to about 420 nanometers under a mask having a predetermined pattern;

contacting the film exposed to the light with an alkali developing solution to dissolve and remove the unexposed portion of the film to obtain a pattern;

heat-treating the pattern at a temperature of greater than or equal to about 180° C. for greater than or equal to about 10 minutes; and placing the heat-treated pattern under a condition of greater than or equal to about 65° C. and relative humidity of greater than or equal to about 65% for greater than or equal to about 10 minutes and less than or equal to about 1 hour to obtain the quantum dot-polymer composite pattern;

wherein the quantum dot-polymer composite pattern comprises a repeating section configured to emit light of a predetermined wavelength, wherein the quantum dot-polymer composite comprises a polymer matrix comprising the linear polymer and the plurality of cadmium-free quantum dots dispersed in the polymer matrix, and wherein the quantum dot-polymer composite has a light absorption rate of greater than or equal to about 85% at wavelength of 450 nanometers.

21. The method of claim 20, wherein the heat-treated pattern is placed under a condition of greater than or equal to about 75° C. and relative humidity of greater than or equal to about 75% or wherein the quantum dot-polymer composite has an area ratio of a hydroxy group peak relative to an acrylate peak of greater than or equal to about 2.6 as determined by Fourier transform infrared spectroscopy.

22. The method of claim 20, wherein in the quantum dot-polymer composite, an amount of the quantum dots is greater than or equal to about 20 weight percent and less than or equal to about 80 weight percent, and an amount of the metal oxide fine particles is greater than or equal to about 4 weight percent and less than or equal to about 15 weight percent, based on a total weight of the quantum dot-polymer composite.

23. A display device comprising a light source and a luminescent element, wherein the luminescent element comprises the quantum dot-polymer composite pattern of claim 1, in which the repeating section comprises a first section configured to emit first light, and a second section configured to emit a second light that is different from the first light, and the light source is configured to provide the luminescent element with incident light.

24. The display device of claim 23, wherein the incident light has a peak wavelength within a range of about 440 nanometers to about 460 nanometers.

25. The display device of claim 23, wherein the light source comprises a plurality of light emitting units respectively corresponding to the first section and the second section, and the light emitting units comprises a first electrode and a second electrode that face each other, and an electroluminescent layer disposed between the first electrode and the second electrode.

26. The display device of claim 23, wherein the display device further comprises a lower substrate, a polarizer disposed under the lower substrate, and a liquid crystal layer disposed between the quantum dot-polymer composite pattern and the lower substrate.

27. The display device of claim 23, wherein the display device is configured to have color reproducibility of greater than or equal to about 80% based on BT2020.

* * * * *